United States Patent
Uejima

(10) Patent No.: US 10,205,437 B2
(45) Date of Patent: Feb. 12, 2019

(54) HIGH-FREQUENCY SWITCH MODULE

(71) Applicant: Murata Manufacturing Co., Ltd., Nagaokakyo-shi, Kyoto-fu (JP)

(72) Inventor: Takanori Uejima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 92 days.

(21) Appl. No.: 15/624,874

(22) Filed: Jun. 16, 2017

(65) Prior Publication Data

US 2017/0288646 A1 Oct. 5, 2017

Related U.S. Application Data

(63) Continuation of application No. PCT/JP2016/052864, filed on Feb. 1, 2016.

(30) Foreign Application Priority Data

Feb. 5, 2015 (JP) .................................. 2015-020842

(51) Int. Cl.
*H01P 1/10* (2006.01)
*H03H 7/01* (2006.01)
(Continued)

(52) U.S. Cl.
CPC ......... *H03H 11/04* (2013.01); *H01F 27/2804* (2013.01); *H03H 7/0115* (2013.01);
(Continued)

(58) Field of Classification Search
CPC . H01P 1/10; H03H 7/01; H03H 11/04; H03H 9/64
(Continued)

(56) References Cited

U.S. PATENT DOCUMENTS

| 2012/0300679 A1 | 11/2012 | Tsutsumi | |
| 2017/0338800 A1* | 11/2017 | Uejima | .................... H03H 7/38 |
| 2018/0026671 A1* | 1/2018 | Uejima | .................... H04B 1/00 |
| | | | 455/78 |

FOREIGN PATENT DOCUMENTS

| JP | 2005-260806 A | 9/2005 |
| JP | 2006-109084 A | 4/2006 |
| JP | 2012-244615 A | 12/2012 |

OTHER PUBLICATIONS

Official Communication issued in International Patent Application No. PCT/JP2016/052864, dated Mar. 15, 2016.

* cited by examiner

*Primary Examiner* — Dean Takaoka
(74) *Attorney, Agent, or Firm* — Keating & Bennett, LLP

(57) ABSTRACT

A high-frequency switch module includes a switch element, a filter element, an inductor, and first and second transmission conductors. The switch element includes a common terminal and first and second selected terminals selectively connected to the common terminal. The first transmission conductor connects the first selected terminal and a SAW filter of the filter element. The second transmission conductor connects the second selected terminal and a SAW filter of the filter element. The inductor is connected between the first and second transmission conductors. A separation distance between at least a portion of the first transmission conductor and a portion of the second transmission conductor is shorter than a separation distance between a land conductor of the first selected terminal and a land conductor of the second selected terminal, and the transmission conductors are capacitively coupled.

15 Claims, 4 Drawing Sheets

(51) Int. Cl.
*H03H 11/04* (2006.01)
*H03H 9/64* (2006.01)
*H04B 1/00* (2006.01)
*H04B 1/40* (2015.01)
*H01F 27/28* (2006.01)
*H04B 1/48* (2006.01)

(52) U.S. Cl.
CPC ............... *H03H 9/64* (2013.01); *H04B 1/00* (2013.01); *H04B 1/40* (2013.01); *H04B 1/48* (2013.01)

(58) Field of Classification Search
USPC .................................................. 333/101, 103
See application file for complete search history.

HIGH-FREQUENCY SWITCH MODULE

CROSS REFERENCE TO RELATED APPLICATIONS

This application claims the benefit of priority to Japanese Patent Application No. 2015-020842 filed on Feb. 5, 2015 and is a Continuation Application of PCT Application No. PCT/JP2016/052864 filed on Feb. 1, 2016. The entire contents of each application are hereby incorporated herein by reference.

BACKGROUND OF THE INVENTION

1. Field of the Invention

The present invention relates to a high-frequency switch module preferably for use in a front end unit of a wireless communication device or other suitable device.

2. Description of the Related Art

With the diversification of communication bands, wireless communication devices, such as cellular phones, are currently provided with front end circuits capable of communicating in many communication bands. Such a front end circuit sends and receives transmission signals and reception signals in a plurality of communication bands using an antenna that is shared among those communication bands. The front end circuit can be made smaller as a result. Switch modules are often used to enable the antenna to be shared among the plurality of communication bands, as disclosed in Japanese Unexamined Patent Application Publication No. 2006-109084.

For example, the switch module disclosed in Japanese Unexamined Patent Application Publication No. 2006-109084 includes a plurality of transmission/reception circuits for a plurality of communication bands, and a SPnT (where n is an integer of 2 or more) switch element. A common terminal of the switch element is connected to an antenna, and a plurality of selected terminals are connected to the respective transmission/reception circuits of the communication bands. According to this configuration, any one of the plurality of transmission/reception circuits for the communication bands are switched and connected to the antenna.

The plurality of selected terminals in such a switch element are often arranged along one side of a housing of the switch element, and the selected terminals are usually close to each other.

Thus, there are cases where high-frequency signals leak among the selected terminals. For example, cases such as those described hereinafter are particularly problematic. The frequency of a harmonic of a signal in a first communication band is close to or the same as a base frequency of a second communication band. A first selected terminal and a second selected terminal are close to each other, and a signal in the first communication band is transmitted to the first selected terminal and a signal in the second communication band is transmitted to the second selected terminal.

In this case, a harmonic component in the first communication band leaks from the first selected terminal to the second selected terminal and is needlessly transmitted to the transmission/reception circuit of the second communication band. This causes transmission characteristics with respect to the second communication band to degrade.

To solve this problem, there is a configuration in which an inductor is connected between a transmission line to which the first selected terminal is connected and a transmission line to which the second selected terminal is connected. Isolation between the first selected terminal and the second selected terminal is ensured by parallel resonance between this inductor (inductance L) and a capacitor (capacitance C) provided by capacitive coupling between the first selected terminal and the second selected terminal.

A resonant frequency of the above-described parallel circuit is $1/(2\pi\sqrt{(LC)})$, and the frequency of a high-frequency signal for which leakage is to be avoided is caused to match this resonant frequency.

However, because the capacitor is provided by capacitive coupling between the first selected terminal and the second selected terminal, the capacitance C is an extremely low value. Thus, it is necessary to increase the inductance L as the frequency of the high-frequency signal for which leakage is to be avoided is fixed (unchanged).

This increases the size of the inductor, which in turn increases the size of the high-frequency switch module.

SUMMARY OF THE INVENTION

Preferred embodiments of the present invention provide small-sized high-frequency switch modules capable of ensuring high isolation on a selected terminal side of a switch element.

A high-frequency switch module according to a preferred embodiment of the present invention includes a switch element, a filter element, an inductor, and first and second transmission conductors. The switch element includes a common terminal and first and second selected terminals selectively connected to the common terminal. The first transmission conductor connects the first selected terminal and the filter element. The second transmission conductor connects the second selected terminal and the filter element. The inductor is connected between the first transmission conductor and the second transmission conductor. A separation distance between at least a portion of the first transmission conductor and a portion of the second transmission conductor is shorter than a separation distance between the first selected terminal and the second selected terminal.

According to this configuration, the capacitance of a capacitor connected in parallel to the inductor is able to be increased by capacitive coupling between the first transmission conductor and the second transmission conductor. This makes it possible to set a fixed (unchanged) resonant frequency of an LC parallel resonance circuit without increasing an inductance.

It is preferable that the high-frequency switch module according to a preferred embodiment of the present invention have the following configuration. The high-frequency switch module further includes a circuit board on which the switch element, the filter element, and the inductor are mounted and in which the first transmission conductor and the second transmission conductor are provided. The first transmission conductor and the second transmission conductor are provided in different layers of the circuit board. When the circuit board is viewed in plan view, the first transmission conductor and the second transmission conductor at least partially overlap.

According to this configuration, the capacitive coupling between the first transmission conductor and the second transmission conductor is able to be strengthened without increasing the surface area of the circuit board.

Additionally, in a high-frequency switch module according to a preferred embodiment of the present invention, it is preferable that the portions of the first transmission conductor and the second transmission conductor that overlap each other have different widths.

According to this configuration, fluctuations in the degree of capacitive coupling (capacitance) caused by interlayer skew, or lamination deviations among dielectric layers of the circuit board and in which conductor patterns are provided are able to be reduced or prevented. This in turn makes it possible to ensure isolation with more certainty.

Additionally, a high-frequency switch module according to a preferred embodiment of the present invention may preferably have the following configuration. The inductor is a spiral-shaped conductor pattern provided in the circuit board. When the circuit board is viewed in plan view, a portion of the spiral-shaped conductor pattern overlaps with at least a portion of the first transmission conductor.

According to this configuration, the inductor is provided within the circuit board, and thus, the high-frequency switch module is able to have an even smaller surface area.

Additionally, in a high-frequency switch module according to a preferred embodiment of the present invention, it is preferable that the portion of the spiral-shaped conductor pattern and the portion of the first transmission conductor that overlap have different widths.

According to this configuration, fluctuations in the degree of capacitive coupling (capacitance) caused by interlayer skew among dielectric layers of the circuit board and in which conductor patterns are provided are able to be reduced or prevented. This in turn makes it possible to ensure isolation with more certainty.

Additionally, in a high-frequency switch module according to a preferred embodiment of the present invention, it is preferable that a ground conductor provided within the circuit board and near the inductor have a shape so that the ground conductor does not overlap with an opening in a central portion of the spiral shape.

According to this configuration, Q degradation in the inductor is effectively reduced or prevented. This makes it possible to further improve the isolation characteristics between the first selected terminal and the second selected terminal.

According to various preferred embodiments of the present invention, small-sized high-frequency switch modules ensure high isolation on a selected terminal side of a switch element. This makes it possible to provide high-frequency switch modules having superior transmission characteristics and a small size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
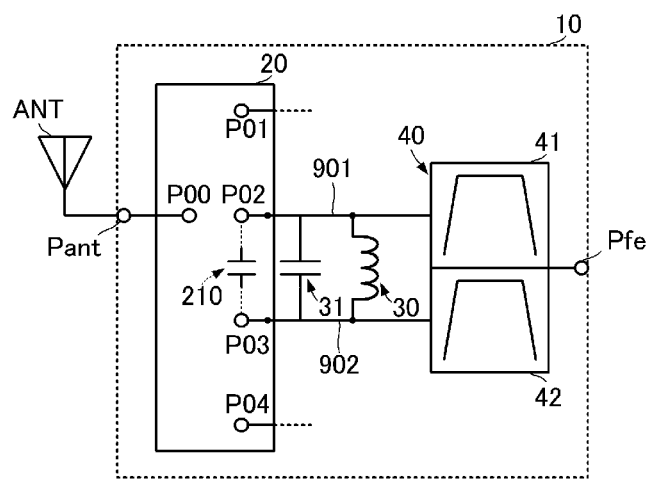
FIG. 1 is a circuit diagram illustrating a high-frequency switch module according to a first preferred embodiment of the present invention.

A high-frequency switch module according to a first preferred embodiment of the present invention will be described with reference to the drawings. FIG. 1 is a circuit diagram illustrating the high-frequency switch module according to the first preferred embodiment of the present invention.

A high-frequency switch module 10 according to the present preferred embodiment includes a switch element 20, an inductor 30, a capacitor 31, and a filter element 40. The filter element 40 includes SAW filters 41 and 42.

The switch element 20 includes a common terminal P00 and selected terminals P01, P02, P03, and P04. The switch element 20 is a SPnT switch preferably defined by semiconductor switches. n may be any integer of 2 or more. The common terminal P00 is selectively connected to any one of the selected terminals P01, P02, P03, and P04.

The common terminal P00 is connected to an antenna connection terminal Pant of the high-frequency switch module 10. The antenna connection terminal Pant is connected to an antenna ANT.

The selected terminal P02 is connected to the SAW filter 41 with a transmission conductor 901 provided therebetween. The selected terminal P03 is connected to the SAW filter 42 with a transmission conductor 902 provided therebetween. The selected terminal P02 corresponds to a first selected terminal, and the selected terminal P03 corresponds to a second selected terminal. The transmission conductor 901 corresponds to a first transmission conductor, and the transmission conductor 902 corresponds to a second transmission conductor.

The SAW filter 41 and the SAW filter 42 have different pass bands. The SAW filter 41 and the SAW filter 42 are connected to a front end terminal Pfe of the high-frequency switch module 10. In other words, the SAW filter 41 and the SAW filter 42 are connected to the front end terminal Pfe at a common terminal on the front end terminal Pfe side (that is, a terminal on the opposite side from the side connected to the selected terminals P02 and P03). This makes it possible to provide the SAW filter 41 and the SAW filter 42 having small sizes.

The inductor 30 is connected between the transmission conductor 901 and the transmission conductor 902. The capacitor is connected between the transmission conductor 901 and the transmission conductor 902. As a result, an LC parallel resonance circuit is connected between the transmission conductor 901 and the transmission conductor 902. The L of the LC parallel resonance circuit is defined by the inductor 30. The C of the LC parallel resonance circuit is defined by a parallel circuit of a capacitor 31 and the capacitor 210 provided between the selected terminals P02 and P03.

The high-frequency switch module 10 having such a circuit configuration is used as follows. In the case of receiving a high-frequency signal in a first communication band, the common terminal P00 and the selected terminal P02 are connected to one another. The SAW filter 41 is set so that a frequency band of the reception signal in the first communication band is within the pass band. The reception signal in the first communication band received by the antenna ANT is inputted to the SAW filter 41 through the switch element 20. The reception signal in the first communication band is filtered by the SAW filter 41 and outputted from the front end terminal Pfe. In the case of receiving a high-frequency signal in a second communication band, the common terminal P00 and the selected terminal P03 are connected to one another. The SAW filter 42 is set so that a frequency band of the reception signal in the second communication band is within the pass band. The reception signal in the second communication band received by the antenna ANT is inputted to the SAW filter 42 through the switch element 20. The reception signal in the second communication band is filtered by the SAW filter 42 and outputted from the front end terminal Pfe.

In such a configuration, the resonant frequency of the LC parallel resonance circuit defined by the capacitors 31 and 210 and the inductor 30 is set to a frequency that corresponds to a harmonic component of the reception signal in the first communication band and that is near or the same as the base frequency of the reception signal in the second communication band. With such a configuration, the LC parallel resonance circuit makes it possible to prevent the harmonic component of the reception signal in the first communication band from being outputted to the front end terminal Pfe even when both of the SAW filter 41 and the SAW filter 42 are connected to the front end terminal Pfe. In other words, in a transmission path of the reception signal in the first communication band and a transmission path of the reception signal in the second communication band, a high isolation is able to be ensured in the transmission path on the front end terminal Pfe side of the switch element 20.

Figure 2:
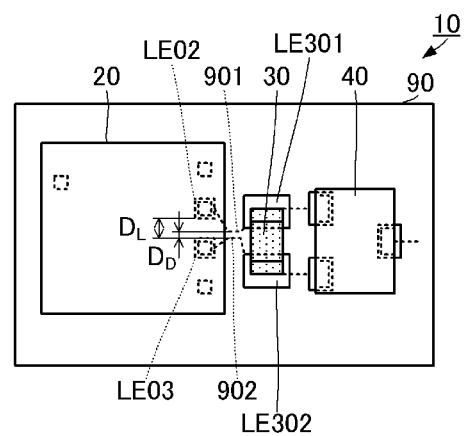
FIG. 2 is a plan view of the high-frequency switch module according to the first preferred embodiment of the present invention.

The high-frequency switch module 10 configured in this manner is able to be achieved with a structure such as that described hereinafter. FIG. 2 is a plan view of the high-frequency switch module according to the first preferred embodiment of the present invention. Note that FIG. 2 illustrates only portions of the high-frequency switch module 10 that are characteristic to a preferred embodiment of the present invention.

The high-frequency switch module 10 includes a multilayer body 90, a surface-mount switch element 20, a surface-mount inductor 30, and a surface-mount filter element 40. The multilayer body 90 preferably is structured by laminating together dielectric substrates in which conductor patterns are provided in predetermined positions. The surface-mount switch element 20, the surface-mount inductor 30, and the surface-mount filter element 40 are mounted on a surface of the multilayer body 90.

A land conductor LE02 on which the selected terminal P02 of the switch element 20 is mounted and a land conductor for the SAW filter 41 of the surface-mount filter element 40 are connected by the transmission conductor 901 included in the multilayer body 90. A land conductor LE03 on which the selected terminal P03 of the switch element 20 is mounted and a land conductor for the SAW filter 42 of the surface-mount filter element 40 are connected by the transmission conductor 902 included in the multilayer body 90.

A land conductor LE301 on which one external conductor of the inductor 30 is mounted is connected to the transmission conductor 901. A land conductor LE302 on which another external conductor of the inductor 30 is mounted is connected to the transmission conductor 902 provided in the multilayer body 90.

The inductor 30 is mounted near the selected terminals P02 and P03 of the switch element 20.

At least a portion of the transmission conductor 901 that connects the land conductors LE02 and LE301 and a portion of the transmission conductor 902 that connects the land conductors LE03 and LE302 are preferably close to each other. More specifically, a separation distance $D_D$ between the portions of the transmission conductors 901 and 902 that are close to each other is shorter than a separation distance $D_L$ between the land conductors LE02 and LE03. The portions of the transmission conductors 901 and 902 that are close to each other define and function as the capacitor 31.

Figure 3:
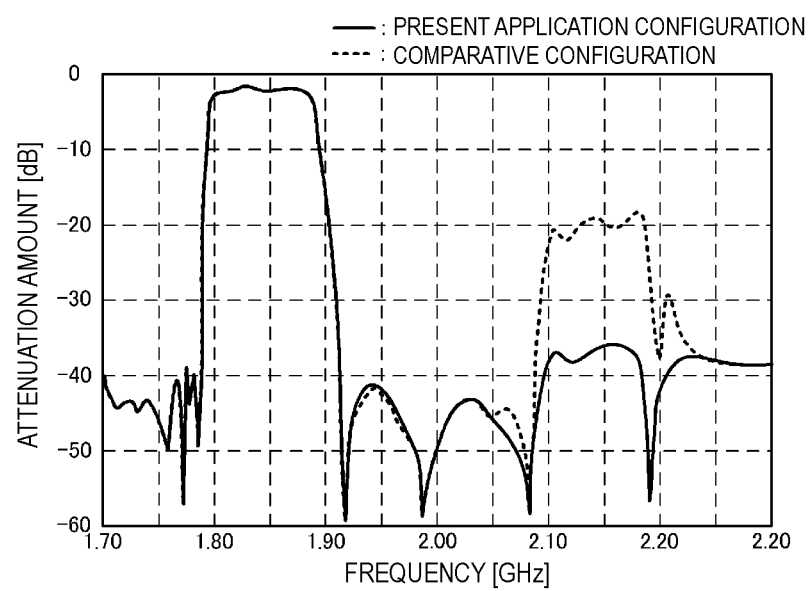
FIG. 3 is a graph illustrating isolation characteristics in the configuration of the high-frequency switch module according to the first preferred embodiment of the present invention and in a comparative configuration.

FIG. 3 is a graph illustrating isolation characteristics in the configuration of the high-frequency switch module according to the first preferred embodiment of the present invention and in a comparative configuration. Note that the comparative configuration refers to a configuration obtained by omitting the inductor 30 from the high-frequency switch module 10 according to the present preferred embodiment.

As illustrated in FIG. 3, although a harmonic component leaks in the comparative configuration, using the configuration of the high-frequency switch module 10 according to the present preferred embodiment makes it possible to reduce or prevent a harmonic component of the reception signal in the first communication band from being outputted from the front end terminal Pfe without exacerbating insertion loss at a base frequency.

In this manner, using the high-frequency switch module 10 according to the present preferred embodiment makes it possible to ensure high isolation on the selected terminal side of a switch element, and to provide a high-frequency switch module having superior transmission characteristics and being smaller using a simple configuration.

Furthermore, the high-frequency switch module 10 according to the present preferred embodiment preferably includes the capacitor 31 in which the C (capacitance) of the LC parallel resonance circuit is defined by the portions of the transmission conductors 901 and 902 that are close to each other. This makes it possible to set the fixed (unchanged) resonant frequency of the LC parallel resonance circuit higher without increasing the size of the inductor 30. Accordingly, the high-frequency switch module 10 is able to be even smaller.

Figure 4:
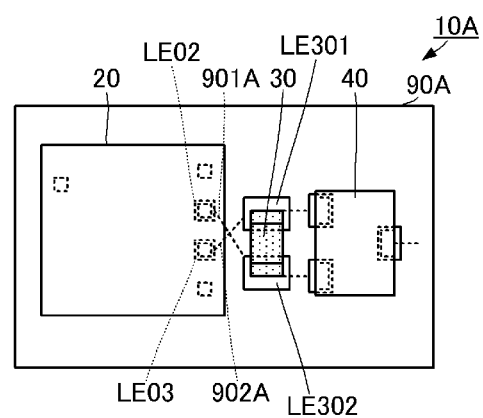
FIG. 4 is a plan view of the structure of a high-frequency switch module according to a second preferred embodiment of the present invention.

Next, a high-frequency switch module according to a second preferred embodiment of the present invention will be described with reference to the drawings. FIG. 4 is a plan view illustrating the structure of a high-frequency switch module according to the second preferred embodiment of the present invention.

A high-frequency switch module 10A according to the present preferred embodiment differs from the high-frequency switch module 10 of the first preferred embodiment in the structure of the transmission conductors 901A and 902A.

The transmission conductor 901A and the transmission conductor 902A are provided at different layers of a multilayer body 90A. The transmission conductor 901A and the transmission conductor 902A are arranged so as to intersect when the multilayer body 90A is viewed in plan view. According to this configuration, the transmission conductor 901A and the transmission conductor 902A partially overlap when the multilayer body 90A is viewed in plan view.

This configuration makes it possible to increase the capacitive coupling between the transmission conductor 901A and the transmission conductor 902A. Doing so makes it possible to increase the C (capacitance) of the LC parallel resonance circuit while reducing the L (inductance), which in turn makes it possible to reduce the size of the inductor 30. Accordingly, the high-frequency switch module 10A is able to have a smaller size.

Figure 5A:
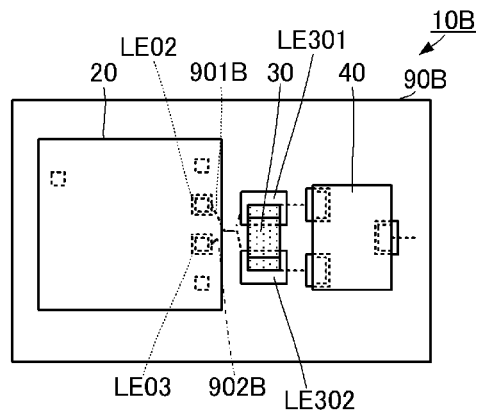
FIGS. 5A and 5B show a plan view and an enlarged view of the structure of a high-frequency switch module according to a third preferred embodiment of the present invention.
Figure 5B:
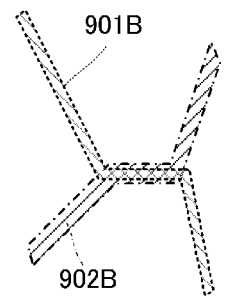

Next, a high-frequency switch module according to a third preferred embodiment of the present invention will be described with reference to the drawings. FIG. 5A is a plan view illustrating the structure of the high-frequency switch module according to the third preferred embodiment of the present invention, and FIG. 5B is an enlarged view of a portion where transmission conductors overlap.

A high-frequency switch module 10B according to the present preferred embodiment differs from the high-frequency switch module 10A of the second preferred embodiment in the structure of transmission conductors 901B and 902B.

Portions of the transmission conductor 901B and the transmission conductor 902B extend in directions that are parallel or substantially parallel to each other. The portions of the transmission conductor 901B and the transmission conductor 902B that are parallel or substantially parallel overlap with each other when a multilayer body 90B is viewed in plan view.

This configuration makes it possible to further increase the capacitive coupling between the transmission conductor 901B and the transmission conductor 902B. Doing so makes it possible to further increase the C (capacitance) of the LC parallel resonance circuit and further reduce the L (inductance), which in turn makes it possible to further reduce the size of the inductor 30. Accordingly, the high-frequency switch module 10B is able to have an even smaller size.

Furthermore, as illustrated in FIG. 5B, the portions of the transmission conductor 901B and the transmission conductor 902B that overlap with each other preferably have different widths. This makes it possible to prevent the degree of capacitive coupling between the transmission conductor 901B and the transmission conductor 902B from changing due to interlayer skew among the plurality of dielectric layers of the multilayer body 90B. As a result, the resonant frequency of the LC parallel resonance circuit is able to be set more precisely. The isolation on the selected terminal side of the switch element is therefore able to be ensured with more certainty.

Figure 6:
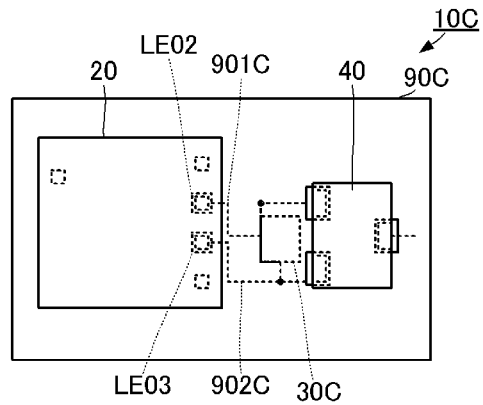
FIG. 6 is a plan view of the structure of a high-frequency switch module according to a fourth preferred embodiment of the present invention.
Figure 7:
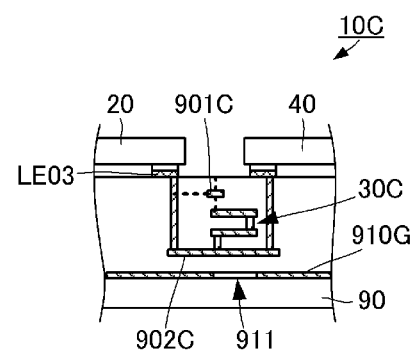
FIG. 7 is a partial cross-sectional view of the structure of the high-frequency switch module according to the fourth preferred embodiment of the present invention.

Next, a high-frequency switch module according to a fourth preferred embodiment of the present invention will be described with reference to the drawings. FIG. 6 is a plan view illustrating the structure of the high-frequency switch module according to the fourth preferred embodiment of the present invention. FIG. 7 is a partial cross-sectional view of the structure of the high-frequency switch module according to the fourth preferred embodiment of the present invention.

A high-frequency switch module 10C according to the present preferred embodiment differs from the high-frequency switch module 10 of the first preferred embodiment in that an inductor 30C is provided within a multilayer body 90C.

The inductor 30C preferably has a spiral shape defined by a conductor pattern provided in the multilayer body 90C. Here, an axis of the spiral of the inductor 30C is preferably parallel or substantially parallel to a lamination direction.

A portion of the inductor 30C and a portion of a transmission conductor 901C overlap when the multilayer body 90C is viewed in plan view.

Such a configuration also makes it possible to provide the LC parallel resonance circuit between the transmission conductor 901C and a transmission conductor 902C and reduce the size of the inductor 30C. Accordingly, the high-frequency switch module 10C as viewed in plan view is able to be made smaller in size than the high-frequency switch module 10 as viewed in plan view.

Note that it is preferable that the width of the conductor pattern that defines the inductor 30C be different from the width of the portion of the transmission conductor 901C that overlaps with the inductor 30C. According to this configuration, the degree of capacitive coupling between the transmission conductor 901C and the inductor 30C is prevented from changing due to interlayer skew among the plurality of dielectric layers that form the multilayer body 90C.

Meanwhile, an internal ground conductor 910G in the multilayer body 90C is provided across approximately the entire surface of the multilayer body 90C viewed in plan view, and includes an opening 911. The opening 911 overlaps with an opening in the center of the spiral-shaped inductor 30C when the multilayer body 90C is viewed in plan view.

By providing such a configuration, a magnetic field produced by the inductor 30C is not impeded by the internal ground conductor 910G, which makes it possible to reduce or prevent Q degradation in the inductor 30C. This in turn makes it possible to further improve the isolation on the selected terminal side of the switch element 20.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A high-frequency switch module comprising:
a switch element including a common terminal and first and second selected terminals selectively connected to the common terminal;
a filter element that is connected to the first selected terminal and the second selected terminal and that includes a common output terminal;
a first transmission conductor that connects the first selected terminal and the filter element;
a second transmission conductor that connects the second selected terminal and the filter element; and
an inductor connected between the first transmission conductor and the second transmission conductor; wherein
a separation distance between at least a portion of the first transmission conductor and a portion of the second transmission conductor is shorter than a separation distance between the first selected terminal and the second selected terminal.

2. The high-frequency switch module according to claim 1, further comprising:
a circuit board on which the switch element, the filter element, and the inductor are mounted and in which the first transmission conductor and the second transmission conductor are provided; wherein
the first transmission conductor and the second transmission conductor are provided at different layers of the circuit board; and
when the circuit board is viewed in plan view, the first transmission conductor and the second transmission conductor at least partially overlap one another.

3. The high-frequency switch module according to claim 2, wherein the portions of the first transmission conductor and the second transmission conductor that overlap one another have different widths.

4. The high-frequency switch module according to claim 2, wherein when the circuit board is viewed in plan view, the first transmission conductor and the second transmission conductor only partially overlap one another.

5. The high-frequency switch module according to claim 2, wherein the portions of the first transmission conductor and the second transmission conductor that overlap one another are parallel or substantially parallel to one another.

6. The high-frequency switch module according to claim 1, wherein
the inductor is a spiral-shaped conductor pattern provided in the circuit board; and
when the circuit board is viewed in plan view, a portion of the spiral-shaped conductor pattern overlaps with at least a portion of the first transmission conductor.

7. The high-frequency switch module according to claim 6, wherein the portion of the spiral-shaped conductor pattern and the portion of the first transmission conductor that overlap have different widths.

8. The high-frequency switch module according to claim 6, wherein a ground conductor provided within the circuit board does not overlap with an opening in a central portion of the spiral-shaped conductor pattern.

9. The high-frequency switch module according to claim 1, wherein the filter element includes at least two surface acoustic wave filters.

10. The high-frequency switch module according to claim 9, wherein the at least two surface acoustic wave filters have different pass bands from one another.

11. The high-frequency switch module according to claim 9, wherein the at least two surface acoustic wave filters are connected to a front end terminal of the high-frequency switch module.

12. The high-frequency switch module according to claim 1, wherein the switch element is a SPnT switch.

13. The high-frequency switch module according to claim 12, wherein the SPnT switch includes semiconductor switches.

14. The high-frequency switch module according to claim 1, further comprising a capacitor connected between the first transmission conductor and the second transmission conductor.

15. The high-frequency switch module according to claim 14, wherein the inductor and the capacitor define an LC parallel resonant circuit.

* * * * *